United States Patent [19]

Acker

[11] 4,053,846

[45] Oct. 11, 1977

[54] AMPLIFIER APPARATUS

[75] Inventor: William F. Acker, Seminole, Fla.

[73] Assignee: Honeywell Inc., Minneapolis, Minn.

[21] Appl. No.: 705,984

[22] Filed: July 16, 1976

Related U.S. Application Data

[62] Division of Ser. No. 589,954, June 24, 1975, Pat. No. 3,992,616.

[51] Int. Cl.² ............................................. H03G 3/30
[52] U.S. Cl. .................................... 330/279; 330/86; 330/110; 330/145
[58] Field of Search .................. 330/29, 86, 110, 134, 330/145

[56] References Cited

U.S. PATENT DOCUMENTS

| 3,553,566 | 1/1971 | Nagy | 330/110 UX |
| 3,634,775 | 1/1972 | Ulmer et al. | 330/145 X |
| 3,736,520 | 5/1973 | Acker | 330/110 X |

Primary Examiner—James B. Mullins
Attorney, Agent, or Firm—Theodore F. Neils

[57] ABSTRACT

A communications receiver transversal filter equalizer is disclosed of the type using fixed increment tap weight adjustments involving use of amplitude data from the incoming signal in conjunction with tap weight adjustments.

17 Claims, 11 Drawing Figures

AMPLIFIER APPARATUS

This is a division, of application Ser. No. 589,954, filed 6/24/75 and now U.S. Pat. No. 3,992,616.

The invention herein described was made in the course of or under a contract, or subcontract thereunder, with the Department of the Air Force.

BACKGROUND OF THE INVENTION

The present invention relates to adaptive equalizers for communication receivers of the transversal filter type and particularly to those utilizing fixed increment tap weight adjustments therein.

As is well known in data communication, the channel between the transmitter and the receiver over which data is transmitted not only distorts, but variably distorts, the data transmitted. To overcome the effects of this distortion on the data transmitted at the receiver, i.e., to reduce the intersymbol interference which occurs as a result of the distortion, adaptive equalizers have been used. Such adaptive equalizers, also known as adaptive transversal filters or adaptive nonrecursive digital filters, are well-known and often used for this purpose.

Figure 1:
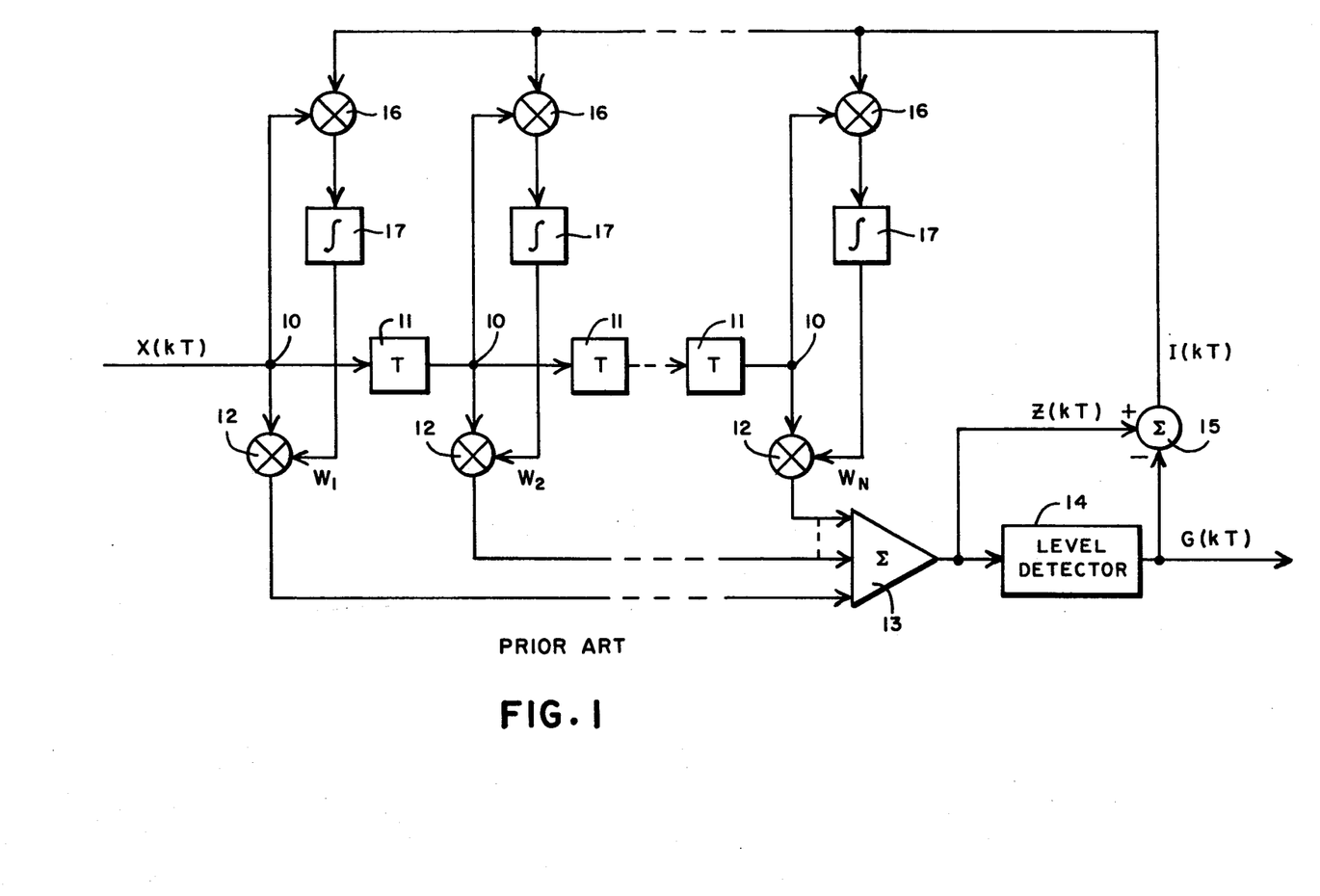
FIG. 1 shows an adaptive equalizer system diagram known in the prior art.

Such a known adaptive equalizer is shown in block diagram form in FIG. 1 and may be considered as a sampled analog, i.e., discrete time system or it may be considered a digitized discrete time system with either an infinite number of bits in each digital word or sufficient bits in each digital word such that any quantization errors are entirely negligible. The operation of the system in FIG. 1 is well-known and is set out below to show the general principles of adaptive equalization.

The adaptive equalizer shown in FIG. 1 operates by measuring the intersymbol interference in the output, cross-correlating this intersymbol interference with each tap output and, on the basis of this cross-correlation result, the adaptive equalizer adjusts itself so that the remaining residual intersymbol interference in the output is uncorrelated with any of the tap output signals occurring at nodes, 10, about each of the delay blocks designated 11 in FIG. 1. The delay blocks 11, and nodes 10 viewed as taps, may be considered together as a tapped delay line. As is shown below, when the output error is uncorrelated with any of the tap inputs, the weights of each of the tap output signals are properly adjusted to an optimum for minimizing the intersymbol interference.

X(kT) in FIG. 1 represents a series of data samples each provided in a sample period of time duration T, i.e., a discrete time input signal, which is supplied to the input node of the tapped delay line mentioned above at time $t=kT$. Again, this tapped delay line comprises the delay blocks 11, also labelled with T's, and the nodes 10 thereabout.

At each node there is provided a tap output signal which is delayed by a number of intervals of duration T equal to the number of delay blocks 11 between that node and the input node at which X(kT) is provided. Each of these tap output signals is supplied to a weighting multiplier, 12, shown as circles also labelled by X, which multiplies the tap output signal by a weighting value, either $\omega_1, \omega_2, \ldots, \omega_N$. The delayed tap output signals as so weighted are then summed by a summing means, 13, to provide a discrete time equalizer output signal, Z(kT).

The difference in value between Z(kT) and an estimate of the actual transmitted signal, G(kT), forms an intersymbol interference indication signal or output error, I(kT). The estimate of the actual transmitter signal is determined by a level detector, 14, which has stored in it the allowed amplitudes of the originally transmitted signals and provides as an output, in each sample period, the allowed transmitted signal amplitude level, G(kT), which is most closely approached by Z(kT). The difference between the allowed transmitted level G(kT) and the filtered signal levels experienced at the filter output, Z(kT), is determined by error summer 15. This difference again is taken as a measure of the intersymbol interference and is used to form the signal I(kT).

The intersymbol interference signal I(kT) is then supplied to a set of adjusting multipliers, 16, these again being represented as circles labelled with an X. These adjusting multipliers also receive the corresponding tap output signal which they multiply with I(kT). The multiplication results are integrated by integrators, 17, to average these multiplication results over time, which completes the cross-correlation between I(kT) and X(kT) to provide the weighting values $\omega_1, \omega_2, \ldots, \omega_N$. In a discrete time system, the integrators 17 are usually summing devices which provide a running total over time.

The system of FIG. 1 is derived from the following analysis. The adaptive equalizer shown there can be described as a technique to minimize in some sense the intersymbol interference distortion function I(kT). Since events in the adaptive equalization system occur only in sample periods, time is discrete occuring in increments each of duration T to yield an expression for time $t=kT$ with $k$ an integer. The sample periods T are those of the sampled input signal or discrete time input signal, X(kT).

The intersymbol interference distortion signal is the following, as stated above, and as can be seen from FIG. 1:

$$I(kT) = Z(kT) - G(kT).$$

The sense in which the intersymbol interference is chosen to be minimized is the means square sense which leads to defining the following function to be minimized:

$$E = \frac{1}{K} \sum_{k=1}^{K} I^2(kT),$$

where K is an arbitrary and large number, the number of $I^2(kT)$ samples to be included in the average.

From FIG. 1, the output of the equalizer at a time $t=kT$ is as follows:

$$Z(kT) = \sum_{n=1}^{N} \omega_n X(kT - nT),$$

which represents a convolution of the discrete time input signal sequence X(kT) and the adaptive equalizer filter characteristic as represented by the sequence of tap output signal weights, $\omega_n$.

Substituting the intersymbol interference equation into the mean square definition and thereafter substituting the equalizer output function into the result of the first substitution yields the following equation for the mean square function:

$$E = \frac{1}{K} \sum_{k=1}^{K} \{ \sum_{n=1}^{N} \omega_n X(kT - nT) - G(kT) \}^2.$$

To find the optimum tap weight values $\omega_n$, this last function must now be minimized with respect to the tap weight values $\omega_n$ which are the independent variables therein. The well-known mathematical step for minimization is to take the N partial derivatives $$\frac{\delta E}{\delta \omega_n},$$

and then setting these partial derivatives equal to zero. For any particular tap weight, $\omega_j$, the following is the partial differentiation result for $1 \leq j \leq N$:

$$\frac{\delta E}{\delta \omega_j} = \frac{2}{K} \sum_{k=1}^{K} \{ \sum_{n=1}^{N} \omega_n X(kT - nT) - G(kT) \} \cdot X(kT - jT)$$

and which can be placed in the following form:

$$\frac{\delta E}{\delta \omega_j} = \frac{2}{K} \sum_{k=1}^{K} I(kT) \cdot X(kT - jT),$$

where, as before, $1 \leq j \leq N$. This last equation is obtained from the preceding one through substitution of the third and then the first of the equations set out above. There are N equations just like the equation set out prior to the last equation set out above and each is set to zero to solve for the $\omega_n$ values to provide the optimum adaptive equalizer. These last equations, when implemented, lead to the system shown in FIG. 1, see multipliers 16 and averaging integrators 17.

The adaptive equalizer shown in FIG. 1 and described in the foregoing paragraphs works very well should ideal components be available therefor at economically attractive prices. However, the multipliers available for analog multiplication have unavoidable offsets in them which cause errors in their outputs leading to a degraded performance. Also, the number of such multipliers required for the sampled analog version of the system shown in FIG. 1 can be quite large, easily exceeding 50.

Further, for a number of reasons, it is usually quite attractive to digitize the implementation shown in FIG. 1 and, to hold costs down in such a version, to use as few bits as possible to represent each digital word occurring in the system. This leads to substantial quantization errors which again seriously degrade the performance of the system shown in FIG. 1.

SUMMARY OF THE INVENTION

An adaptive transversal equalizer, or an adaptive discrete time signal filter, is disclosed which, in adjusting the weightings of the tap output signals therein by only fixed increments, also uses amplitude information contained in the discrete time input signal to either prevent or allow such adjustments to be made in a particular instance. In a further embodiment of the invention, this amplitude information is used also to control the average amplitude of the discrete time input signal.

DESCRIPTION OF THE PREFERRED EMBODIMENTS

To reduce the number of multipliers in FIG. 1, and hence the cost, the adjusting multiplier shown there can be replaced by fixed increment, but algebraic sign variable, circuits such as monostable multivibrators or, in a digitized version, EXCLUSIVE OR logic gates. Continuing to describe a sampled analog embodiment, the use of fixed increment adjustments avoids the need for any magnitude value multiplications but also throws away this magnitude information contained in the signals that were supplied to the adjusting means multipliers. Thus, once a fixed magnitude increment is to be used, only sign information contained in the signals which were supplied to the adjusting multiplier means need be used to determine the polarity of the fixed magnitude increment to be sent on for the purpose of adjusting the weights applied to the tap output signals. Then series of such fixed increments changes will apparently continue to provide the adaptive filter characteristics required of the equalizer.

To alter the system of FIG. 1, to use fixed increment adjusting means rather than adjusting multipliers, requires that the signals that were supplied to the adjusting multipliers carry the information needed to determine the sign of the errors currently present in the weighting factors to be applied to the tap output signals. Of course, this must be the case for the system of FIG. 1 to operate satisfactorily to reduce these errors. That such information is contained in the foregoing equations for the system of FIG. 1 can be shown as follows.

Define a weighting factor which has an error therein as follows:

$$\omega_n = \omega_{no} + e_n$$

where $\omega_n$ is the optimum value of the tap weight and $e_n$ represents the error in the tap weight.

Substituting the immediately preceding definition into the second to last equation set out above yields:

$$\frac{\delta E}{\delta \omega_j} = \frac{2}{K} \sum_{k=1}^{K} \{ \sum_{n=1}^{N} (\omega_{no} + e_n) X(kT - nT) - G(kT) \} \cdot X(kT - jT)$$

Noting that by the definition of G(kT) that $$G(kT) = \sum_{n=1}^{N} \omega_n X(kT - nT),$$

the preceding equation for the partial differential can be written as follows by substituting this definition for G(kT) therein:

$$\frac{\delta E}{\delta \omega_j} = \frac{2}{K} \sum_{k=1}^{K} \{ \sum_{n=1}^{N} e_n X(kT - nT) \} \cdot X(kT - jT),$$

again $1 \leq j \leq N$.

Expanding this last equation yields:

$$\frac{\delta E}{\delta \omega_j} = \frac{2}{K} \sum_{k=1}^{K} e_j X^2(kT - jT)$$
$$+ \frac{2}{K} \sum_{k=1}^{K} \sum_{\substack{n=1 \\ n \neq j}}^{N} e_n X(kT - nT) X(kT - jT)$$

Bringing the $e_n$ terms out of the summation over K and interchanging the order of summation yields:

$$\frac{\delta E}{\delta \omega_j} = 2e_j [\frac{1}{K} \sum_{k=1}^{K} X^2(kT - jT)]$$
$$+ \sum_{\substack{n=1 \\ n \neq j}}^{N} 2e_n [\frac{1}{K} \sum_{k=1}^{K} X(kT - nT) X(kT - jT)]$$

The summations with respect to $k$ in the preceding equation can be recognized as autocorrelation functions of the discrete input signal which, over sufficiently large K, can be assumed to approach zero except where $n = j$ for the class of discrete input signals of concern, i.e., an uncorrelated discrete time input signal.

Thus, when taking statistical expectations, the value of the first bracket term is equal to the average signal power per sample (which will be represented by the symbol $x^2$) and the value of the second bracket term is equal to zero. Hence, the preceding equation reduces to the following for $1 \leq j \leq N$:

$$\frac{\delta E}{\delta \omega_j} \approx 2e_j X^2,$$

where $X^2$, the discrete input signal power, is always a positive quantity.

Thus, the sign of $$\frac{\delta E}{\delta \omega_j}$$

provides, after averaging over a sufficient number of samples, the sign of the error $e_j$ as is required for controlling the adaptive process.

Thus, if there exists an error in the tap weight values, the system of FIG. 1 will compute a correctional signal related to the tap weight error and the computed correction signal will have the proper sign information for adjusting the tap weight values to reduce the tap weight error. This follows from the system of FIG. 1 being implemented in accordance with the right hand side of the last equation in the background section above which equation shows that multipliers 16 and averaging integrators 17 compute $$\frac{\delta E}{\delta \omega_j}.$$

However, while merely using the sign information, and not the magnitude information also, to control the adjustments of the weighting multipliers appears feasible from the foregoing, serious problems arise in so doing. The use of a fixed increment adjustment only, i.e., using only sign information but not magnitude information in making the adjustments of the weighting multipliers, has a destabilizing influence on the adaptive equalizer of FIG. 1, which is, of course, a feedback system.

In practice, several other destabilizing influences are likely to be present already in the system of FIG. 1. These include unavoidable offsets in the multipliers leading to errors in the multiplication results and, in the case of digital systems, quantization noise. These destabilizing effects have been found to be greatly aggrevated when partial response signaling techniques are used such as the duobinary technique.

The adaptive equalizer is supposed to estimate the intersymbol interference and make decisions on which way to adjust the weighting factors to reduce such errors. If these decisions are relatively good, the equalizer can usually obtain a sufficient indication of the error components through the correlating to thereby improve its weighting factor values for application to the tap output signals. This should improve the error estimate further and give a better setting yet for the weighting factors, etc. However, in an equalizer having stability problems due to various destabilizing influences such as mentioned above, rather than the error estimates getting better they may get worse and the adaptive equalizer may wander far from the filter characteristic desired given the current condition of the transmission channel.

To improve stability, using of magnitude information in the feedback portion for adjusting the weighting multipliers is, as the system of FIG. 1 has demonstrated, a most significant aid. Thus, if FIG. 1 was digitized, rather than using merely the sign bits in the digital words representing I(kT) and the sign bits in the digital words representing the tap output signals, one could add additional bits containing mangitude information to provide varying increment changes. However, this would require that the adjusting multipliers 16 be considerably more complicated and costly than merely EXCLUSIVE OR logic gates. As stated above, to save costs, use of a fixed increment adjustment means in place of weighting multipliers is also very desirable, which precludes changes in the magnitudes of the adjusting increments.

Figure 2:
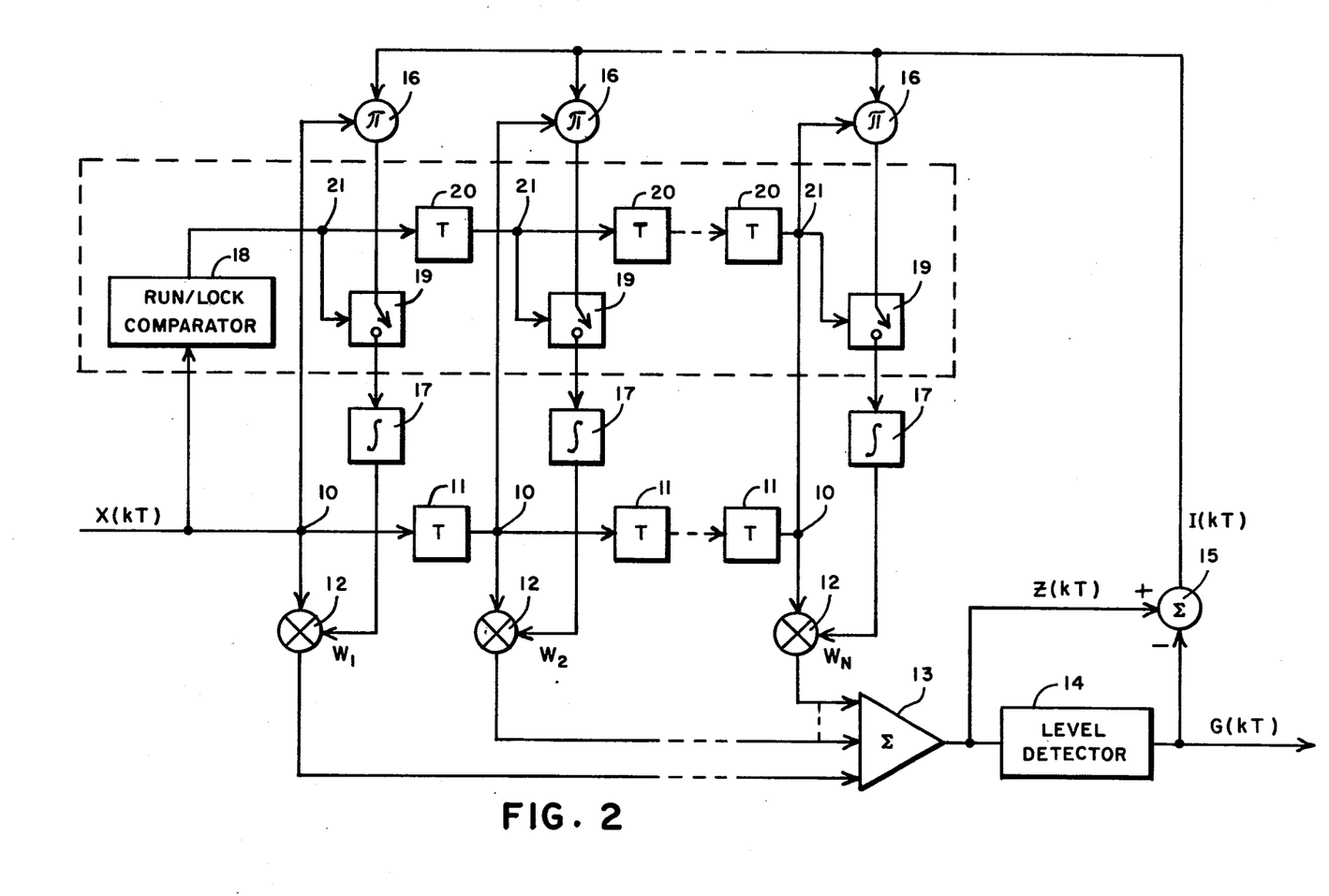
FIG. 2 shows a system diagram of a first embodiment of the invention.

FIG. 2 shows another method to add some amplitude information to the weighting factor adjusting process while still retaining fixed increment adjustments for the weighting multipliers 12. Components in the system diagram of FIG. 2 which have not changed from FIG. 1 are labelled again with the same numerical designations as they were in FIG. 1. However several new components have been added to FIG. 2 which are contained within the closed dotted outline. The first of these components is a run/lock comparator, 18, which receives as an input the discrete input signal X(kT). The magnitude of the discrete input signal samples are compared against a reference threshold, and only if these input samples exceed that threshold is there output from the run/lock comparator 18 to close the first of the inhibiting switches 19. As can be seen, until inhibiting switch 19 is closed the fixed increment adjustment supplied by the adjusting means 16 cannot be added to the first integrator 17 to affect the average used to control the first weighting multiplier 12. Thus, only those input data samples which have a sufficiently significant amplitude are allowed to affect the average at the output of the first integrator 17 and so the first weighting multiplier 12. Input data samples which are too small and hence likely to be substantially affected by any multiplier offsets, quantization noise and other noise are not allowed to affect the weighting multiplier 12. Disregarding the small samples substantially improves equalizer stability.

As the input data sample passes from the first node 10 through the first delay 11 to the second node 10, the run/lock comparator 18 decision which was applied to the first inhibiting switch 19 passes through delay element 20 to affect the second inhibiting switch 19 at the same time that this corresponding data sample affects the second weighting multiplier 12. This continues to propagate down the sets of filter components until the $N^{th}$ inhibiting switch is reached and the $N^{th}$ multiplier means is reached.

Thus, there is another tapped delay line provided in FIG. 2 made up of delay blocks 20 and the nodes 21 thereabout at which signals are tapped to control the inhibitory switches 19. This delay line, however, could be eliminated by having separate run/lock comparators, just like run/lock comparator 18, provided to control each of the inhibitory switches 19. This gives an equivalent system if the same threshold level is set in each of the other comparators as is set in run/lock comparator 18. Different threshold levels could be assigned to these other comparators, however.

The setting chosen for the threshold level, either in a system with a single run/lock comparator, such as comparator 18 shown in FIG. 2, or, as described above, a system with a run/lock comparator for each inhibitory switch 19, depends on the absolute values of the discrete input signal amplitudes, among other things, and an optimum setting can be found to minimize I(kT). Because of the nature of the system shown in FIG. 2, in attempting to have Z(kT) approach a set of fixed allowed transmitted levels as closely as possible, increasing the average of the absolute value of X(kT), i.e. $|X(kT)|$, results in lowering the expected values of the operational magnitudes of $\omega_1, \omega_2, \ldots, \omega_N$ which multiply X(kT) and vice versa. This situation puts limits on the acceptable expected value of $|X(kT)|$. Taking first a sampled analog system, increasing the expected value of $|X(kT)|$ to too great a level results in having the weighting factors of $\omega_1, \omega_2, \ldots \omega_N$, too small with respect to offset errors in the weighting multipliers leading to larger output errors. On the other hand, if the expected value of $|X(kT)|$ is too small, internally generated noise will affect X(kT) to a greater degree. In either case, the range of input values in which the weighting multipliers will properly respond is limited.

In a digitized system, the situation is worsened because neither the expected value of $|X(kT)|$ nor the weighting factors should be allowed to be too small with respect to the quantization noise which results from digitization. Further, register lengths holding the digital words representing X(kT) and the weighting factors are of a fixed capacity and any overflow due to digital words of too great a length will introduce further errors.

The threshold levels in either a single run/lock comparator system or a system with several run/lock comparators can be adjusted to lead to a minimum output error at any given time depending on the statistics of the discrete input signal, X(kT). If the statistics of the discrete input signal is stationary so that the average of its absolute value is independent of time, then a single fixed threshold value level can be established for any run/lock comparator without having to adapt the threshold level to the changing statistics of the discrete input signal. Thus, i) the need to control the amplitude range in which the discrete time input signal occurs, to keep errors in the system to a satisfactory level and to not exceed the capabilities of components used in the system, and ii) the desirability of using a fixed threshold and so a stationary input signal level, leads to the use of an automatic gain control system to achieve these goals concerning the statistics of the discrete time input signal.

Such an automatic gain control system can, of course, be placed anywhere ahead of the adaptive equalizer in a communication receiver system and will aid substantially in achieving the goal of holding constant the average of the absolute value of the equalizer discrete time input signal. There will typically be several possibilities in the receiver system from which the control for the automatic gain control system can be developed. However, because a well controlled automatic gain control system is so important for proper operation of the adaptive equalizer, the best control source for the automatic gain control system for the receiver system is the adaptive equalizer itself. This can be easily accomplished in the system of FIG. 2 as is shown in FIG. 3.

Figure 3:
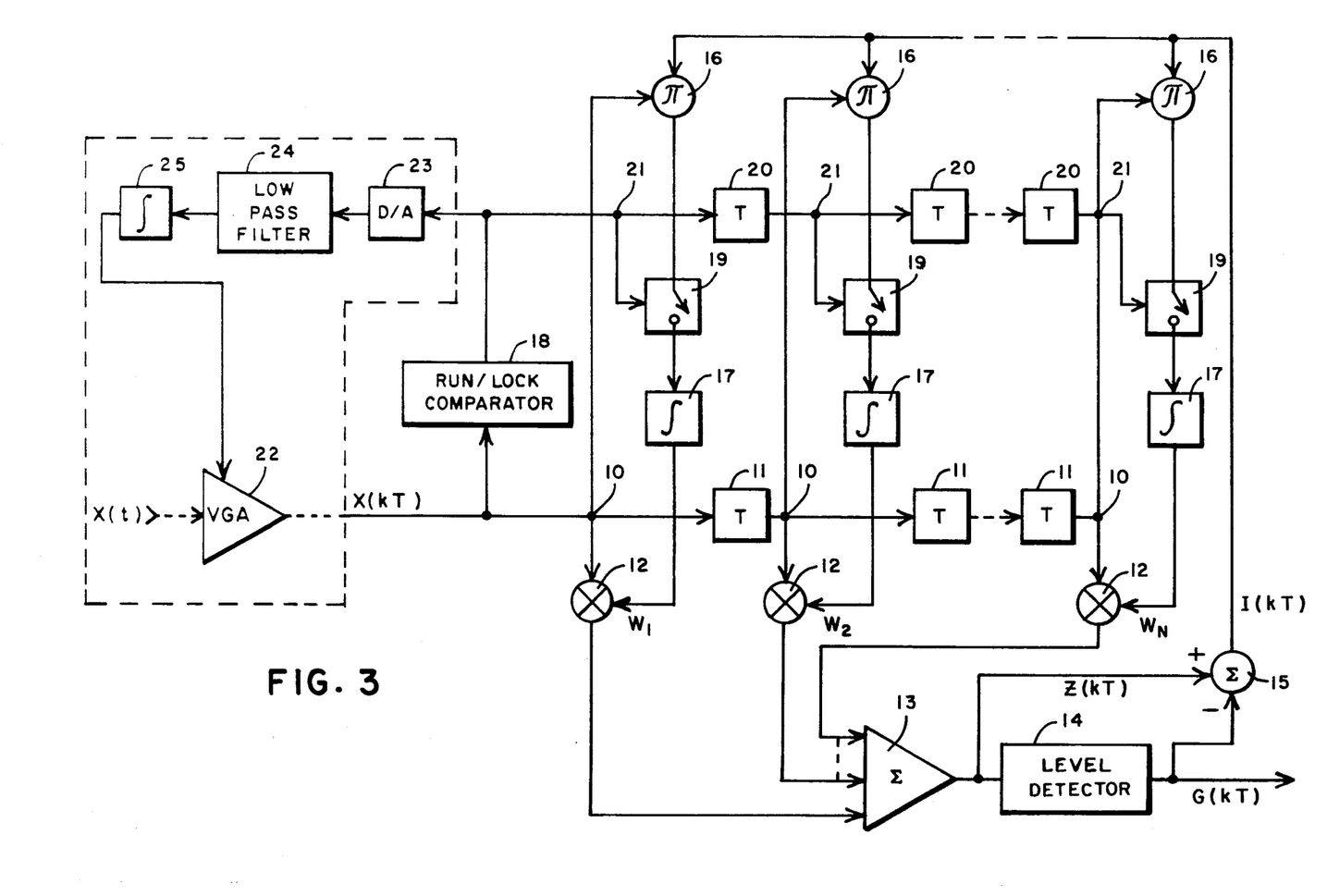
FIG. 3 shows a system diagram of a further embodiment of the invention.

Turning now to FIG. 3, the components which appeared also in FIG. 2 are again labelled with the same numerical designations in FIG. 3 as they were labelled in FIG. 2. The control signal used to operate the variable gain amplifier 22 for the automatic gain control system is taken from the output signal of the run/lock comparator 18 and the new components to do this plus the newly added variable gain amplifier 22 are shown within a closed dotted line. The control loop within the closed dotted line acts to control the average amplitude of $|X(kT)|$ so that a selected fraction of input data samples will be large enough to cause the run/lock comparator to close the inhibitory switches 19 for that chosen fraction of input signal samples. This holds the expected value of $|X(kT)|$ stationary with respect to a selected threshold value as desired, and allows the threshold value and the run/lock fraction to both be selected to minimize the output errors of the equalizer.

The run/lock comparator signal is a two-level signal which acts to either close or leave open the inhibitory switches 19 and so appears as a two level or binary, 1-bit signal. What amounts to a 1-bit digital to analog converter, 23, receives the output signal of the run/lock comparator 18. The analog output voltage from the converter 23 is passed through a lowpass filter, 24, and through an integrator, 25, to average this signal over time. The integrator integrates only that portion of the signal which differs from a reference voltage determined by the desired fraction of inhibitory switch close signals from the run/lock comparator 18 averaged over time.

The variable gain amplifier 22 is shown with a continuous signal applied to its input and with a continuous output signal to be applied to a sampler (not shown) to finally provide a discrete time signal X(kT) to be applied to the adaptive equalizer input. There are broken lines shown on either side of the amplifier to show that there may be other receiver system sections inserted either before or after the amplifier including the sampler. Clearly, the sampler could be placed in front of the variable gain amplifier 22 so that only a discrete signal would be passed through variable gain amplifier 22.

Figure 4:
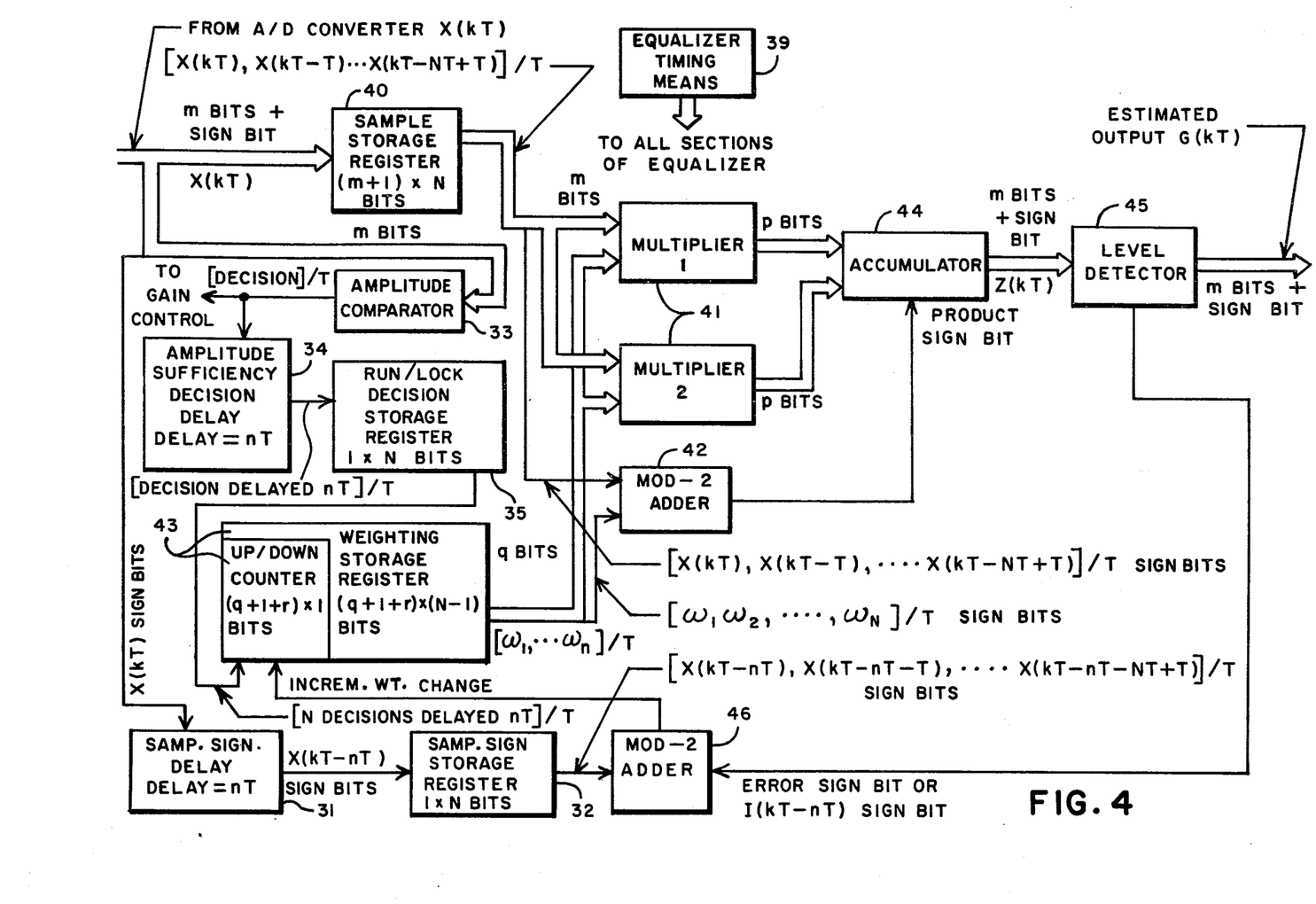
FIG. 4 shows a system diagram of a digitized version of the system shown in FIG. 3.

A digitized version of FIG. 3 is shown in FIG. 4 with similar signals represented by the same symbols. Thus, the discrete input signal of FIGS. 1 through 3, X(kT), is again the input signal in FIG. 4. X(kT) there is indicated to come from an analog to digital converter to show that X(kT) is now a digitized discrete time input signal having m magnitude bits plus a single sign bit. A sample storage register, 40, receives the input data samples in X(kT) and stores as many of them as there are filter sections in FIG. 3, that is to say there are N stored input data samples. The sample storage register 40 is a N word, $m+1$ bit, parallel organized, clocked shift register memory which corresponds to the tapped delay line means of FIG. 3 comprising nodes 10 and delay blocks 11.

As the sample register 40 is shifted by clock pulses provided by the equalizer timing means, 39, each digital word representing a data sample from X(kT) is shifted one position in the shift register closer to the output port and the digital word at the output port is recirculated back through the input storage position of the shift register and then further on in to the shift register. Each stored input data sample is shifted through all the shift register storage positions plus one further position in a given sample period except the earliest stored input data sample; this earliest stored input data sample is discarded and the new input sample in X(kT) for the given sample period is inserted in its place. The output signal from the sample storage register 40 is then represented in FIG. 4 by [X(kT), X(kT-T), . . . ,X(kT-nT)]/T to indicate that the current sample and the N-1 preceding samples are presented at the register output in a single sample period, T.

After each position shift in the sample storage register 40, the magnitude portion of the digital word representing an input data sample then at the output of the shift register is parallel transferred to a multiplier, either to multiplier 1 or to multiplier 2 provided in multiplier section designated 41. The sign bit from the digital word at the output of storage register 40 is advanced to a modulo-2 adder, 42.

The multiplier section 41 corresponds to the weighting multipliers 12 of FIG. 3. Two separate multipliers are used in the multiplier section 41 to obtain the necessary high rate of multiplications required, since multiplication section 41 must provide all of the weighted input samples sequentially within the time of one sample period, T. The other digital word to be multiplied in multiplier section 41, with the portion of the digital word representing an input data sample magnitude, is provided from the weighting storage register 43.

The weighting storage register 43 includes effectively the inhibitory switching means 19 and the integrators 17 of FIG. 3. The output of the weighting storage register 43 represents the weighting $\omega_1, \omega_2, \ldots, \omega_N$, each a digital word, to be applied to the input data samples by the multipliers in multiplier section 41 and by the modulo-2 adder 42. All of the weighting factors are presented at the output of register 43 in a single sample period, T, and so are represented by $[\omega_1, \omega_2, \ldots \omega_N]/T$ as the output signal of register 43 in FIG. 4. The method of forming of the weighting factors is set out below.

The discrete weighting input samples provided at the outputs of multiplier section 41 and modulo-2 adder 42 in a sample period, i.e. the N multiplication products formed by multiplying the input data samples and the corresponding weighting factors, are supplied sequentially as formed to the accumulator, 44. All of these N multiplication products are added together in the accumulator in the sample period in which they are supplied to provide a total for the given sample period. Accumulator 44 thus serves as the summing means 13 of FIG. 3. The total provided at the end of each sample period at the output of accumulator 44 represents the discrete time equalizer output signal, Z(kT), which is supplied to a level detector, 45.

The level detector 45 corresponds to the level detector means 14 and subtractor means 15 of FIG. 3. Level detector 45 produces, as outputs thereof, the estimated output signal, G(kT), and the sign bit of the error signal, i.e., the sign bit of the intersymbol interference signal I(kT). Again level detector 45 determines an output digital work in G(kT) on the basis of determining the closest allowed transmitted level approached by the corresponding digital word in Z(kT). The difference which results between the corresponding digital words of G(kT) and Z(kT) forms a digital word in I(kT), the sign bit of which is an output from level detector 45.

The error sign bit provided from detector 45 in a particular sample period is transmitted to modulo-2 adder 46 where it is sequentially modulo-2 added to, i.e., polarity coincident correlated with, the sign bits of the pertinent input data samples from the equalizer input signal as they are presented, i.e. those N input data samples which gave rise to this sign bit provided from detector 45. Due to a necessary delay in computing I(kT), the error sign bit available at $t=kT$ is not that from I(kT) but from that error signal which was computed using input data from period $t=kT-nT$, i.e., using the input data available when the input data sample X(kT-nT) was current. The error sign bit available at $t=kT$ is then that of I(kT-nT) and, for proper incrementing of the weighting factors, this error sign bit must be used in conjunction with the input data samples which give rise to it.

A sample sign delay means, 31, and a sample sign storage register, 32, are used to provide the input data which was available at $t=kT-nT$. Delay means 31, receives the input data sign bits from the system input signal and provides a delay of nT sample periods before transmitting these sign bits to the recirculating shift register, sign storage register 32. Thus, register 32 contains the sign bits from the N input data samples which were in the sample storage register, register 40, nT sample periods earlier. These sample sign bits in register 32 are completely recirculated through register 32 in a sample period T in step with register 43 during which also the oldest stored sign bit is dropped and the next sign bit from delay means 31 is accepted. This leads to representing the output of register 32 as [X(kT-nT), X(kT-nT-T), . . . X(kT-nT-NT+T)]/T SIGN BITS. Each weighting factor in weighting storage register 43 is always incremented based on the input sample sign starting from the same storage position in sample sign register 32 in each sample period prior to the first shift occurring in either register in that sample period.

To use the most current error information, the error sign bit based on input data available in the immediately preceding sample period would be use, i.e. n=1. In that case, n=1, the data input sample sign bit would be delayed one sample period by the delay element 31 to give both signals reaching adder 46 an equal delay.

Thus, modulo-2 adder 46 corresponds to fixed increment adjusting means 16 of FIG. 3, but due to the nature of the tapped weighting storage register 41, there need be only one modulo-2 adder 46 which can be used repeatedly in determining each weighting factor rather than requiring the plurality of fixed incremental adjusting means 16 used in FIG. 3. The modulo-2 addition, or polarity coincident correlation, of modulo-2 adder 46 can be accomplished by use of EXCLUSIVE OR logic gates.

As stated, repeated use of modulo-2 adder 46 in place of the plurality of fixed increment adjusting means shown in FIG. 3 is possible because of the nature of the weighting storage register 43. This is a shift register that has as many shift positions in it as does the sample storage register 40 and so can hold as many digital words representing weighting factors as sample storage register 40 can hold digital words representing-stored data input samples.

The weighting factors are recirculated through weighting register 43 once in every sample period in step with the recirculation of input data samples in sample storage register 40, including circulation of the weighting factors through the count digit positions in weighting register 43. However, the digital word length of the digital word corresponding to each weighting factor is substantially longer as stored in tap weighting storage register 43 than the word length of the weighting factor actually supplied to the multipliers 41. The register word length of the weighting factors exceeds the word length of the actually used weighting factor digital words by $r$ bits. These $r$ bits are the least significant bits and rather than being part of the actually used weighting factor digital word, they are integration bits used in the time averaging process which effectively occurs and the up/down counter in the first register position in the weighting storage register 43.

By having the output of modulo-2 adder 46 serially drive the up/down counter by the fixed increment change represented by one bit, should such a change be indicated which would result in either increasing or decreasing the count stored in the counter, the fixed increment changes occurring are averaged over time to form the weighting factor in the up/down counter. The up/down counter is prevented from having the count therein erroneously restarted through its being driven beyond its proper counting range. Each weighting factor so formed is then shifted through the remaining storage positions of the weighting storage register 43 to the output thereof and at that point supplied to multiplier section 41 and modulo-2 adder 42 to properly weight the corresponding stored input data sample arriving from sample storage register 40. Each weighting factor in weighting storage register 43 always weights the stored input data sample starting from the same storage position in sample storage register 40 in each sample period prior to the first shift occurring in either register in that sample period.

The amplitude comparator, 33, of FIG. 4 serves as the run/lock comparator 18 shown in FIG. 3 and receives the magnitude portions of the digital words representing the input data samples. The amplitude comparator 33 decides whether the amplitude of each of these data input samples exceeds a selected threshold value for purposes of determining whether the corresponding incremental weighting change supplied to the weighting register 43 at its first storage position up-/down counter should be allowed to affect the corresponding weighting factor. Comparator 33 provides a decision output signal once a sample period and so this output signal is represented in FIG. 4 as [DECISION]/T. This signal is supplied to the amplitude sufficiency delay means, 34.

This output signal from the amplitude comparator 33 is also supplied to the gain control circuitry ahead of the input to the adaptive equalizer in just the manner shown in FIG. 3. For a communication system which provides the receiver with (+1, 0, -1) class 4 partial response input signals, the optimum threshold setting for amplitude comparator 33 was found to be one where comparator 33 permitted about 50% of the incremental weighting changes to affect corresponding weighting factors.

The delay means 34 delays the decision bits from comparator 33 the same amount as the input sample sign bits are delayed by sample sign delay means 31 and delay means 34 transmits these delayed decision bits, one in each sample period T, to the run/lock decision storage register, 35, which is a recirculating shift register. The output signal from delay means 34 is represented as [DECISION DELAYED nT]/T in FIG. 4.

As a result, the decisions stored in the register 35 are just the ones made for each of those input data samples having the sign bit corresponding thereto stored in the sample sign storage register 32. The decision storage register 35 shifts in step with weighting storage register 43 to thereby provide all of the stored decisions in register 35 to register 43 in a sample period T. Thus, the decisions bits from the determination of whether to allow an increment or not are effective in register 43 at times so as to properly correspond to the input sample sign bit reaching adder 46 for forming the increment. That is to say, each input data sample from which a sign bit is used in forming an increment for adjusting a corresponding weighting factor is also the sample from which the magnitude bits are used in forming a decision as to whether the increment formed with the sign bit should be used to adjust the weighting factor. So, the output signal from register 35 is transmitted to the up-/down counter in register 43 for allowing or inhibiting the incrementing of each weighting factor digital word passing through that counter in response to the incremental weighting change signal from modulo-2 adder 46.

Register 35 drops the oldest stored decision bit and stores the most recently supplied decisions once each sample period as well as circulating once therein. The output from register 35 is represented as [N DECISIONS DELAYED nT]/T in FIG. 4. Register 35 corresponds to the second tapped delay means comprising delay blocks 30 and nodes 21 in FIG. 3.

Another possibility for providing the run/lock decisions to the weighting storage register 43 involves remaking the decision with respect to each input data sample every time the sample is used in the incrementing of the weighting factors in register 43. This could be accomplished by taking the input signal for amplitude comparator 33 from the output of the sample storage register 40 and eliminating the run/lock decision storage register in the signal path to weighting storage register 43. Means to hold the input data samples X(kT−NT−T)→X(kT−NT−nT) earlier discarded by register 40 and means to ignore in the present sample period the input data samples X(kT)→X(kT−nT) must be provided to keep the decision bits corresponding the sign bits of the input data samples be provided to modulo-2 adder 46. Obviously, a similar arrangement could be made for supplying the input data sample sign bits to modulo-2 adder 46 by taking the sign bits from the output of sample storage register 40.

The implementation shown in FIG. 4, however, makes it easier to supply the decisions from the comparator 33 for the current input data sample without substantial delay to the variable gain amplifier (the variable gain amplifier shown in FIG. 3), to improve performance of this feedback loop. Also, hardware implementation was found easier using common length recirculating shift registers.

Often in treating the incoming data signal in a communications receiver prior to presenting it to the receiver equalizer, bias or offset signals, i.e., signals which are substantially constant for a relatively long period of time, are introduced into the data signal causing a shift in the expected value or average value of this signal. A receiver portion in which this typically occurs is the analog to digital converter usually used in converting an analog voltage input signal to a discrete time signal in a digitized form prior to supplying it to the equalizer, as in FIG. 4. Even if bias, or offset, voltages could be nulled out of such a voltage input signal by adjustment at a given point in time, aging of electronic components during subsequent times will lead to such bias voltages developing at a later time. Zero frequency components, i.e., bias signals, cause errors in the receiver equalizer or in subsequent receiver subsystems if they have an erroneous amplitude.

Figure 5:
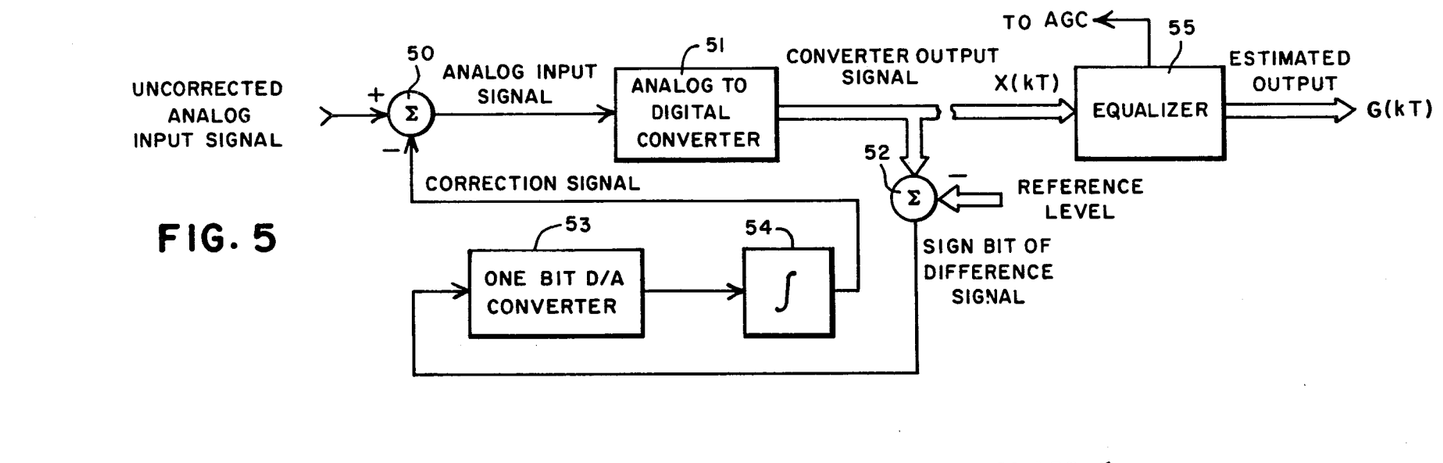
FIG. 5 shows a system diagram of a further embodiment of the invention.

Erroneous bias signals can be removed by the bias signal removal system of FIG. 5 if, indeed, the input signal to the receiver is designed not to contain any zero frequency components. FIG. 5 shows this system preceding the equalizer, 55, of FIG. 4 and the uncorrected analog input signal is chosen as a voltage input signal as is X(kT). This voltage input signal should not be subjected to any operations prior to being presented to the bias signal removal system which skew the distribution of voltage signal amplitudes about zero, or some other reference level, if zero or that other reference level is the desired point about which the bias voltages are to be zero. Such skewing might come from clipping of the voltage input signal or saturation of some active element passing this signal. The system of FIG. 5 will, when there is a skewing of the voltage input signal magnitudes, certainly remove the resulting zero frequency components in the skewed signal, but in doing so, a different than intended reference level may result. Also, the voltage input signal should be randomly distributed with respect to the allowed transmitted levels, when reaching the bias removal system so that the polarity of this signal is as likely to be positive as it is to be negative.

In FIG. 5, an uncorrected analog input signal, uncorrected for bias, i.e., offset, voltages are applied to a summing means, 50. Also applied to summing means 50 is a correction signal which, when combined with the uncorrected analog input signal, provides an analog input signal to an analog to digital converter, 51. This analog input signal has been corrected to remove bias voltages by having the correction signal cancel them. Converter 51 provides a converter output signal which can be the X(kT) signal of FIG. 5 to be applied directly to the equalizer, but need not be as indicated by the broken arrow, i.e., other receiver subsystems might intervene.

The converter output signal is also supplied to another summing means, 52, which also has supplied to it a reference level signal. Typically, summing means 52 is not used because the desired reference level signal will be zero. In that instance, rather than the sign bit of a resulting difference signal being supplied to the input of a one-bit digital to analog converter, 53, the sign bit of the converter output signal will be supplied to converter 53.

Converter 53 produces an analog output signal which comprises a sequence of voltage pulses, one such voltage pulse supplied for each sign bit received by converter 53. These voltage pulses are uniform at least to the extent of having substantially equal absolute values of the time integral of each pulse, but the direction of the voltage excursion for each pulse would be either positive or negative. This polarity would depend on the state of the sign bit supplied to converter 53 from either summing means 52 output difference signal or, in its absence as set out above, from the converter output signal.

The resulting output signal from converter 53, the analog signal of sequential voltage pulses as stated above, is applied to an integrator, 54, to average these voltage pulses over time to provide the correction signal. The average of these voltage pulses will be zero over the time of averaging if, during that time, the sign signal received by converter 53 bit is in the high level state as often as it is in the low level state. However, for a disproportionate number of high states in the sign bit difference signal or a disproportionate number of low states, there will be a change in the signal level out of the integrator, the correction signal to be summed in summing means 50. This correction signal will have a polarity which will tend to reduce the bias voltage in the uncorrected analog input signal giving rise to the disproportionate number of high or low voltage pulses. Thereby the number of highs and lows in the sign bit difference signal will be made more nearly equal.

The system of FIG. 5 works satisfactorily for a (1,0,−1) class 4 partial response uncorrected analog input signal, a signal with an odd number of levels, but does not work so well on signals with an even number of levels such as two level or four level pulse amplitude modulated data signals. This class of signals has two characteristics which lead to a relatively poor performance by the system of FIG. 5. First, this class of signals may convey long series of positive or negative pulses at the allowed signal levels which will cause spurious bias voltage corrections if the averaging time of the integrator 54 is relatively short compared to these long runs. Second, these signals do not have a zero level in the allowed transmitted signal levels and so the bias drift in the signal must be great enough to cause one of the allowed signal levels to cross the zero line before any corrective action would be taken by the system of FIG. 5. The distance from zero to the allowed transmitted levels on either side of zero leads to rather large bias errors being tolerated by the system of FIG. 5 to the detriment of subsequent receiver subsystems.

Setting the reference level in FIG. 5 to the value of one of the signal levels among the allowed even number of signal levels, and either adjusting the count ratio of converter 53 or adding a bias voltage level to integrator 54, would allow the system of FIG. 5 to accomodate these signals with an even number of signal levels. This kind of a system, however, would be gain sensitive depending on the gain ahead of the bias removal system unles some compensating scheme is used.

Figure 6:
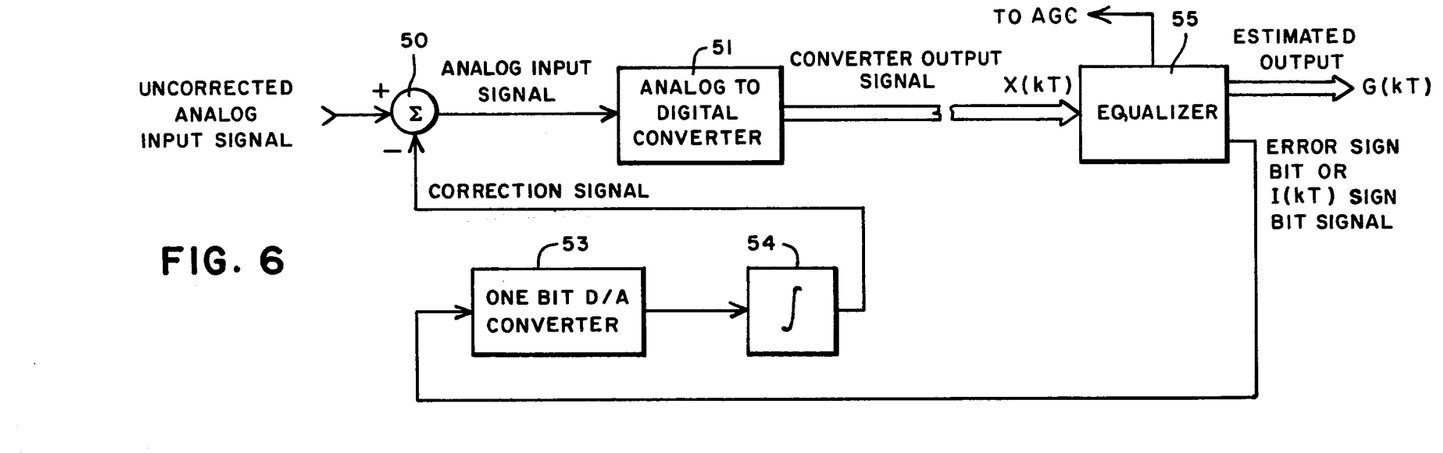
FIG. 6 shows a system diagram of a further embodiment of the invention alternative to that shown in FIG. 5.

A significant improvement over the system shown in FIG. 5 for input signals having an even number of allowed signal levels, or otherwise containing desired zero frequency components, is shown in FIG. 6. The components in FIG. 6 which are also present in FIG. 5 are again labelled with the same numerical designations in FIG. 6. The adaptive equalizer, 55, of FIG. 6 now supplies, as the sign bit feedback signal the very error sign bit or I(kT) sign bit signal which is developed and used in FIG. 4 (where the signal used was actually I(kT−nT). Thus, the equalizer 55 in FIG. 6 now takes an active part in the bias voltage removal system whereas the equalizer has no direct role in the operation of the system of FIG. 5.

The operation of the system of FIG. 6 is exactly that of the system of FIG. 5 with the exception of taking the sign bit feedback signal from the equalizer rather than from either the converter output signal or from the summing means 52 output difference signal of FIG. 5. However, the system of FIG. 6 provides a bias removal system without introducing gain sensitivity because the equalizer 55 is attempting to produce an equalizer output signal such that the error of intersymbol interference I(kT) will be zero and not some fixed level above or below zero as in the case of the converter output signal in FIG. 5. Thus, the system of FIG. 6 provides an excellent bias voltage removal system for signals having an even number of allowed signal levels, the excellence going so far as to eliminate nulling adjustments upon manufacture and to eliminate later nulling adjustments for correcting the results of aging in use of electronic components in receiver systems.

The system of FIG. 6, however, does not operate satisfactorily where the input signal to be presented to the equalizer has an odd number of allowed signal levels, or no desired zero frequency components, since the equalizer will cancel out the unwanted zero frequency components itself and so provide no error signal to the bias removal system of FIG. 6. Even though the equalizer will remove zero frequency components, use of the bias removal system in FIG. 5 in this situation is desirable to avoid having the tap weights in the equalizer take on the values necessary to remove these few frequency components. This is because the tap weights have too restricted a range of values in fixed size registers if they must operate about values necessary to remove zero frequency components and too many taps or weighted input sample values are required in the equalizer to effect such a correction satisfactorily.

As may be noted from FIGS. 3 and 4 and from FIGS. 5 and 6, a one-bit digital to analog converter has been used twice in the system of FIG. 6. FIG. 7 shows again the bias removal system diagram of FIG. 6 but with a circuit diagram inserted therein showing a possible construction combining both the one-bit digital to analog converter and the integrator used in both FIGS. 5 and 6. A flip-flop, 70, of the delay type (D type) is shown receiving the error sign bit at the flip-flop delay input, D. The output of flip-flop 70, Q, and its complement output, $\overline{Q}$, are connected to a differential integrator comprising an operational amplifier, 71, with its associated resistors and capacitors labelled R and C. A disproportionate number of high state outputs at output Q and conversely low state outputs at $\overline{Q}$, or vice versa, over the integration period will result in a differential signal being supplied to the integrator and an output therefrom.

Figures 7, 8, 9:
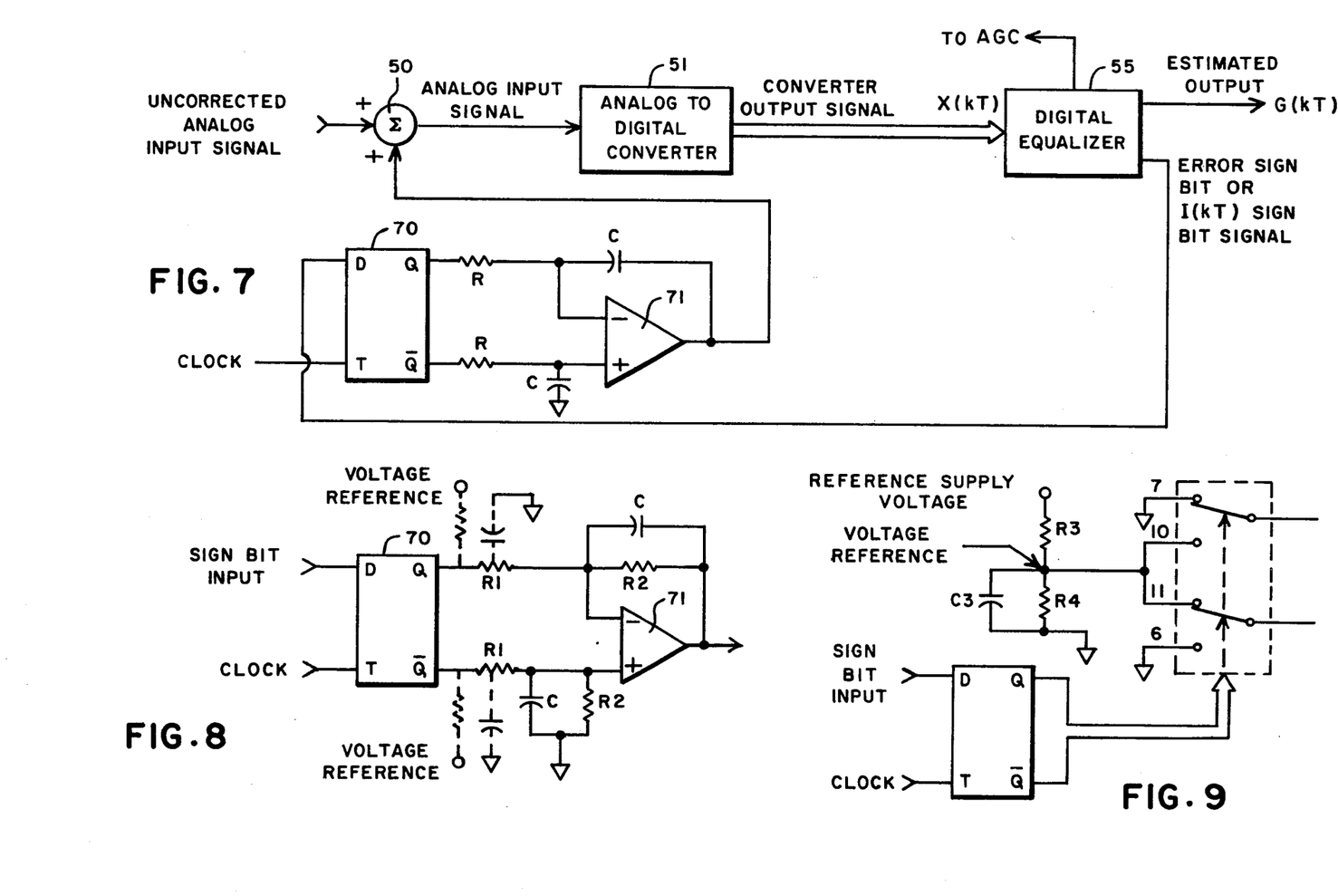
FIG. 7 shows a more specific system diagram of the embodiment of the system shown in FIG. 6.
FIG. 8 shows a system and circuit diagram alternative for a portion of the system shown in FIG. 7.
FIG. 9 shows a system and circuit diagram alternative for a portion of the system shown in FIGS. 7 and 8.

Should a one-bit digital to analog converter be used with a separate integrator following, the differential integrator can be converted to a differential lowpass filter as is shown in FIG. 8, ignoring the dashed-line circuit components. In either case, the output signal and the complement output signal from the flip-flop are substracted from one another so that if one or the other is in a high state more of the time, the output of the operational amplifier will reflect this in the polarity of its resulting output.

If either the high or low level state voltages in flip-flop 70 are too variable for precise bias removal system operations, the outputs of flip-flop 70 can be used to control an analog switch which has a precise reference voltage provided thereto as in FIG. 9. Operation is just as shown in FIGS. 7 and 8 except the precise reference voltage is transmitted to the differential circuit, and good grounding is provided.

Should only the high level state voltage in flip-flop 70 of FIGS. 7 or 8 be too variable or should the added hardware of FIG. 9 be too complex or costly, the high level state voltages effectively supplied to amplifier 71 can be matched very closely to one another and to a voltage reference level by use of the dashed-line resistors shown in FIG. 8. Obviously, a flip-flop with open collectors or buffers after the flip-flop 70 with open collectors could be used in conjunction with these resistors. These dashed-line resistors are each small in value compared to the value of the resistors $R_1$. Also, the dashed-line capacitors shown in FIG. 8 improve performance of the circuit by attenuating the high frequencies in the square wave signals due to flip-flop 70 before they are applied to amplifier 71. Amplifier 71 would not approximate an ideal infinite operational amplifier if the input signal supplied thereto required a performance in excess of the amplifier gain at slew rate capabilities. These dashed-line capacitors are shown at a center tap of resistors $R_1$ but, obviously, two resistors may be used for each resistor $R_1$. These modifications can also be used in the circuit shown in FIG. 7.

The variable gain amplifier, shown in FIG. 3 and which is to be operated by the automatic gain control (AGC) circuitry as indicated in FIG. 4, must both be capable of precisely controlling gain over a wide range and have the rather wide passband needed to be capable of passing the frequencies contained in the data in the incoming signal received by the communications receiver. One possibility is the amplifier disclosed in U.S. Pat. No. 3,736,520 to the present applicant and assigned to Honeywell Information Systems, Inc. This amplifier, however, because of the overall feedback loop used, does not perform as satisfactorily as desired at higher frequencies. The overall feedback loop introduces noise and distortion and is subject to becoming unstable and oscillatory given the higher frequencies required to be passed.

Figure 10:
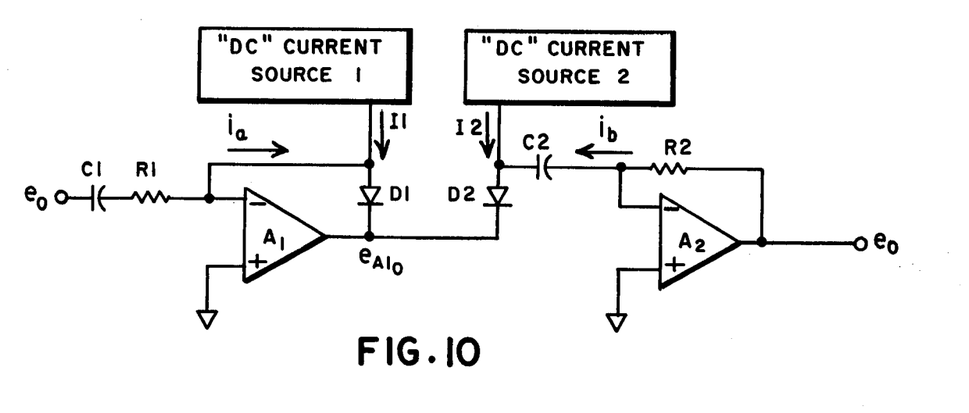
FIG. 10 shows a system and circuit diagram of a further aspect of the invention.

An amplifier with some similarity to the amplifier of the above mentioned patent, but which does not use overall feedback, is shown in FIG. 10 in somewhat simplified form. The gain control of the amplifier shown in FIG. 10 depends on the non-linear characteristics of the semiconductor diodes used, $D_1$ and $D_2$. These signal diodes follow rather closely an exponential voltage-current characteristic, a characteristic, as is well known, that many semiconductor diodes follow very accurately. That exponential law is as follows:

$$I_D = I_S(\exp \frac{qV_D}{kT} - 1)$$

where $I_D$ equals the diode current, $I_S$ equals the reverse saturation current of the diode, $V_D$ equals the voltage drop across the diode, $q$ equals charge on an electron, $k$ equals Boltzmann's constant, and T equals the absolute temperature. This is the well-known "ideal diode" law.

The ration between any two operating points, 1 and 2, on the diode curve can be found from the above equation, assuming that the diode is forward biased so that $V_D$ is positive and the exponential is substantially larger than the value 1 as follows:

$$I_{D1,1} = I_S(\exp \frac{qV_{D1,1}}{kT} - 1) \approx I_S \exp \frac{qV_{D1,1}}{kT}$$

$$I_{D1,2} = I_S \exp \frac{qV_{D1,2}}{kT}$$

$$\frac{I_{D1,2}}{I_{D1,2}} = \frac{\exp \frac{qV_{D1,2}}{kT}}{\exp \frac{qV_{D1,1}}{kT}}$$

$$V_{D1,2} = V_{D1,1} + \frac{kT}{q} \ln \frac{I_{D1,2}}{I_{D1,1}}$$

Operational amplifiers $A_1$ and $A_2$ shown in FIG. 10 are standard operational amplifiers having a high input impedance, a high gain, a low output impedance and a bandwidth sufficient for the particular application contemplated. As stated, diodes $D_1$ and $D_2$ are assumed to each follow the above diode law, as most signal diodes do, and are taken to be well matched in both characteristics and in temperature. Such diodes are available from many sources commercially and are usually in a single package which may be temperature controlled. Often, the emitter base junction of two transistors on a single chip are used to form diodes such as $D_1$ and $D_2$. The variable gain amplifier of FIG. 10 is an AC coupled amplifier since the data received in the communications receiver is taken to be provided in such a format (duobinary for instance). The use of AC coupling permits avoiding the use of an overall feedback loop as used in the patent referenced above.

"DC" current sources 1 and 2 both provide what appears to be steady DC current in operation, at least with respect to the relatively rapid changes in the input signal, $e_i$.

Operation of the variable gain amplifier in FIG. 10 can best be understood by the following analysis. The operational amplifier $A_1$, because of its high gain, will maintain its inverting input approximately at the voltage level of its non-inverting input, which is ground as shown in FIG. 10. Thus, the voltage at the output of amplifier $A_1$, $e_{Alo}$ will be equal to the voltage drop across diode $D_1$. The drop across diode $D_1$ can be taken from the diode current ratio equation given above if voltage $V_{D1,1}$ is taken to be the voltage drop across the diode with no input signal present and voltage $V_{D1,2}$ is taken to be the voltage drop across diode $D_1$ when the input signal voltage is present. This gives the following:

$$V_{D1,1} = V_{D1,dc}$$

$$e_{Alo} = V_{D1,2} = V_{D1,ac+dc}$$

$$e_{AlO} = V_{D1,ac + dc} = V_{D1,dc} + \frac{kT}{q} \ln \frac{I_1 + i_a}{I_1}$$

Then, the AC component of the voltge at the output of amplifier $A_1$, $e_{Alo,ac}$ the difference in the voltage drop across the diode $D_1$ when the input signal is present and when its not present, is found as follows:

$$e_{Alo,ac} = V_{D1,ac} = V_{D1,ac + dc} - V_{D1,dc}$$
$$= V_{D1,dc} + \frac{kT}{q} \ln \frac{I_1 + i_a}{I_1} - V_{D1,dc}$$
$$e_{Alo,ac} = V_{D1,ac} = \frac{kT}{q} \ln \frac{I_1 + i_a}{I_1}$$

Operational amplifier $A_2$ also maintains its inverting input near the value of its non-inverting input, again ground, because of the high gain of amplifier $A_2$. Thus, if the capacitor $C_2$ is chosen large enough so there is a negligible voltage drop thereacross due to AC or signal voltage components, the anode of diode $D_2$ will be at AC ground and the AC components of the voltage drop across diode $D_2$ will equal that across diode $D_1$. Also, because diode $D_2$ follows the same "ideal diode" law as does diode 4 and is well matched thereto, the AC voltage component across diode $D_2$, $V_{D2,ac}$, will be related to the current therethrough in the same way as is the voltage drop across diode $D_1$ yielding:

$$V_{D2,ac} = \frac{kT}{q} \ln \frac{I_2 + i_b}{I_2}$$

Then, equating the AC voltage components across the two diodes as indicated above, the following is obtained:

$$e_{Alo,ac} = V_{D1,ac} = V_{D2,ac}$$

$$\frac{kT}{q} \ln \frac{I_1 + i_a}{I_1} = \frac{kT}{q} \ln \frac{I_2 + i_b}{I_2}$$

$$1 + \frac{i_a}{I_1} = 1 + \frac{i_b}{I_2}$$

$$\frac{i_a}{i_b} = \frac{I_1}{I_2}$$

Taking the input capacitor $C_1$ to be large enough to have a negligible voltage drop due to AC or signal voltage components across it, with the inverting input of amplifier $A_1$ maintained nearly at ground, the following input voltage relationship holds:

$$e_i = i_a R_1$$

With the inverting input of amplifier $A_2$ also maintained at ground and with the high input impedance of amplifier $A_2$, the current $i_b$ must be supplied through resistor $R_2$. Then the output voltage, $e_o$, must equal the voltage drop across $R_2$ due to the current $i_b$ therethrough or:

$$e_o = i_b R_2$$

Combining the last three equations yields the following:

$$\frac{\frac{e_i}{R_1}}{\frac{e_o}{R_2}} = \frac{I_1}{I_2}$$

$$VGA \text{ gain} = \frac{e_o}{e_i} = \frac{R_2 I_2}{R_1 I_1}$$

The preceding gain expression shows that the gain can be adjusted by varying any or all of $R_1$, $R_2$, $I_1$ and $I_2$. The equation also shows that, for well matched diodes $D_1$ and $D_2$, that temperature changes do not affect the gain of the amplifier.

There are limits on adjusting the ratios of the currents $I_1$ and $I_2$ to set the gain of the variable gain amplifier because of the following:

i. Both of these currents must be greater than the peak negative value of the AC current components, $i_a$ or $i_b$, to prevent the diodes $D_1$ and $D_2$ respectively from becoming reversed biased.

ii. These currents must not become too large with respect to either $i_a$ or $i_b$ to prevent the AC voltage drops across diodes $D_1$ and $D_2$ from becoming too small with respect to background noise levels.

iii. The currents through diodes $D_1$ and $D_2$ should remain in a range where the "ideal diode" law is closely followed by the diodes $D_1$ and $D_2$.

In most applications, the currents $I_1$ and $I_2$ will be in the range of one and a half to five times the peak amplitudes of $i_a$ and $i_b$ for satisfactory operation. Since one of the above equations shows that the ratio of $i_a$ to $I_1$ must equal the ratio of $i_b$ to $I_2$, selection of either $I_1$ or $I_2$ to set one of these ratios in the ratio range of satisfactory operation will assure the other ratio is similarly set.

When the currents $I_1$ or $I_2$ are to be used to vary the gain of the amplifier in operation, the choice of which one to hold fixed or whether to hold either fixed depends on the application for the variable gain amplifier. Where, as here, it is intended to maintain the data coming out of the amplifier at a fixed average value, current $i_b$ peaks will be relatively constant and holding $I_2$ fixed is the best choice while varying $I_1$ as needed to obtain the desired gain. In other applications, another choice might well be made.

Taking $I_2$ fixed, a variable gain amplifier can be provided which has a gain directly proportional to the control voltage by merely making $I_1$ proportional to the control voltage, i.e., using a linear voltage controlled constant current source. However, for the variable gain amplifier of FIG. 3 it is desirable to have an amplifier in which the logarithm of the amplifier gain (the gain in db's) is linearly proportional to the control voltage. Obviously, in other circumstances, other functions of the control voltage could be used to control current $I_1$.

Figure 11:
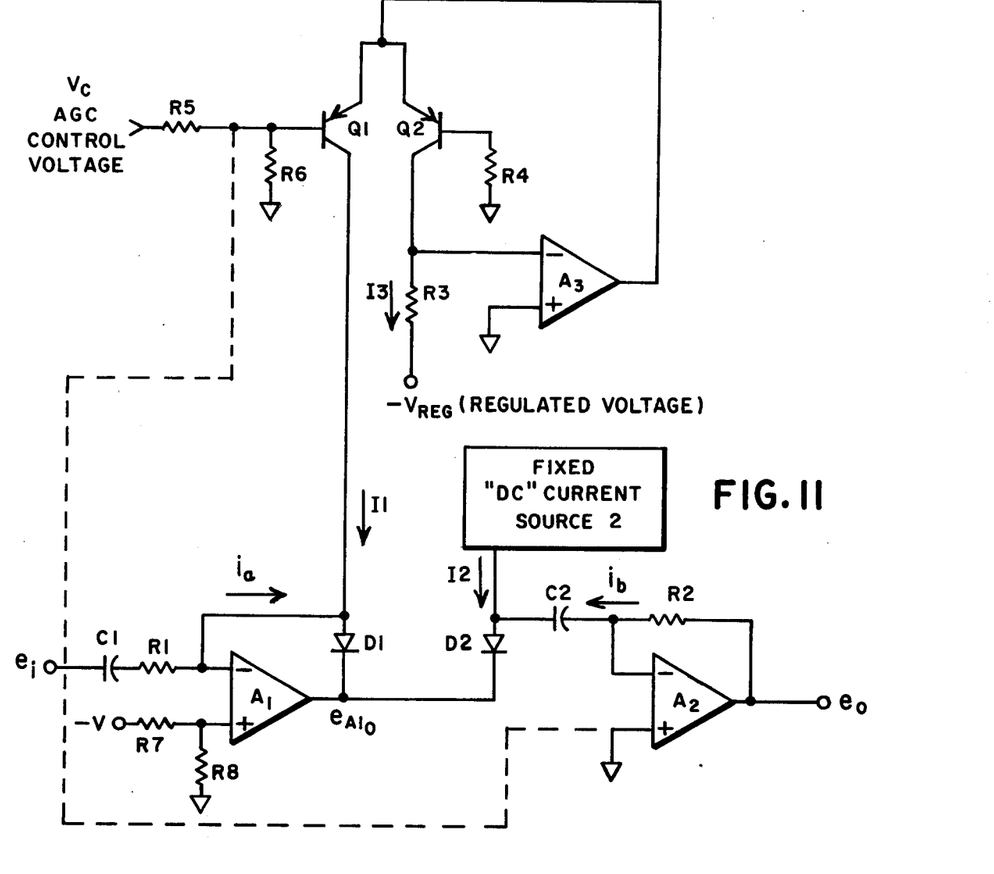
FIG. 11 shows a system and circuit diagram of a further embodiment of the system shown in FIG. 10.

FIG. 11 shows a circuit for providing $I_1$ such that the logarithm of the voltage gain of the variable gain amplifier will be proportional to the control voltage, or equivalently, that the voltage gain of the voltage gain amplifier is related exponentially to the control voltage.

Transistors $Q_1$ and $Q_2$ are a well matched pair, both in characteristics and in temperature, which are again available commercially often in a single chip. The transistors are shown as pnp transistors, but the polarities in the circuit can, of course, be reversed to allow use of npn transistors. Operational amplifier A3, an operational amplifier much like or the same as operational amplifiers $A_1$ and $A_2$, adjusts the emitter voltage level for transistors $Q_1$ and $Q_2$.

In operation, due to the high gain of operational amplifier $A_3$, the voltage at its inverting input is maintained approximately at its non-inverting input voltage level or, again in this case, at ground. Since resistor $R_3$ is also connected to a well regulated voltage, the voltage drop across it is kept quite constant and current $I_3$ must also keep quite constant by the adjusting of the emitter voltage for transistors $Q_1$ and $Q_2$ by amplifier $A_3$.

$Q_1$ and $Q_2$ are well matched, as stated above, and with each having an equal resistance from its respective base to ground and in the absence of any applied control voltage, the voltage drop across the base-emitter junction for each transistor are equal. Hence, the collector currents through the transistor are equal. Thus, for $R_4$ equal to the equivalent parallel resistance of resistors $R_5$ and $R_6$, $I_3$ equals $I_1$ in the absence of any control voltage. Therefore, $I_1$ has a known value prior to the application of any control voltage. Then, the variable gain amplifier has a known overall gain given the preceding equation above which resulted from the analysis of FIG. 10.

Note that resistors $R_7$ and $R_8$ form a voltage divider circuit which places the non-inverting input of amplifier $A_1$ at a DC reference voltage somewhat below ground level to thereby provide a voltage drop from the base of transistor $Q_1$ to the collector thereof to serve as a collector bias voltage for $Q_1$. This does not affect the operation or the preceding analysis of the system shown in FIG. 10 because neither the operation nor the analysis is DC voltage level dependent at the output of amplifier $A_1$. This is so because the capacitors therein provide DC voltage isolation and because current sources are used to provide the bias currents to set the gain of the variable gain amplifier.

The application of a control voltage will shift the voltage across the base emitter junction of transistor $Q_1$ and will thereby alter current $I_1$ and thus the gain of the variable gain amplifier. The base-emitter junction of transistor $Q_1$ acts as a diode insofar as the emitter current and the voltage drop across this base-emitter junction are concerned. This diode follows quite accurately, for most signal transistors, the "ideal diode" law set out above. Thus, it is the base-emitter junction characteristic response to the applied control voltage which allows $I_1$ to be the desired function of $V_c$.

The following analysis makes the foregoing description more specific. Rewriting the "ideal diode" law in its ratio form from above for the emitter-base junction of the transistor $Q_1$ gives the following:

$$V_{BE,Q_1(V_c \neq 0)} = V_{BE,Q_1(V_c = 0)} + \frac{kT}{q} \ln \frac{I_{Q_1,E(V_c \neq 0)}}{I_{Q_1,E(V_c = 0)}}$$

or $$\frac{I_{Q_1,E(V_c \neq 0)}}{I_{Q_1,E(V_c = 0)}} = \exp \frac{q}{kT} [V_{BE,Q_1(V_c \neq 0)} - V_{BE,Q_1(V_c = 0)}]$$

As is well known, the following relationship holds between the collector and emitter currents of a transistor operated in its normal ranges:

$$I_{Q_1,C} = I_{Q_1,E} \frac{\beta}{1+\beta}$$

For fairly high transistor current gains which do not change too drastically over the range of operation of transistor $Q_1$, the foregoing equation allows the following ratio equation to be written:

$$\frac{I_{Q_1,C(V_c \neq 0)}}{I_{Q_1,C(V_c = 0)}} = \frac{I_{Q_1,B(V_c \neq 0)}}{I_{Q_1,B(V_c = 0)}}$$

As noted above, the collector current for transistor $Q_1$ equals that of transistor $Q_2$ in the absence of any applied control voltage. This allows writing the preceding equation as:

$$\frac{I_{Q_1,C(V_c \neq 0)}}{\frac{V_{REG}}{R_3}} = \frac{I_{Q_1,B(V_c \neq 0)}}{I_{Q_1,B(V_c = 0)}}$$

Also, following from the current gain of transistor $Q_1$ being high is that its base current is negligible. As a result, the following equation can also be seen to hold at the base of transistor $Q_1$:

$$V_{BE,Q_1(V_c \neq 0)} - V_{BE,Q_1(V_c = 0)} = - \frac{R_6}{R_5 + R_6} V_c$$

Substituting these last two equations into the $Q_1$ base-emitter junction diode equation above yields:

$$\frac{I_{Q_1,C(V_c \neq 0)}}{\frac{V_{REG}}{R_3}} = \exp - \frac{q}{kT} \left( \frac{R_6}{R_5 + R_6} \right) V_c$$

The collector current of $Q_1$ for an applied control voltage seem to be just current $I_1$ and so that preceding equation can be written:

$$I_1 = \frac{V_{REG}}{R_3} \exp - \frac{q}{kT} \left( \frac{R_6}{R_5 + R_6} \right) V_c$$

This last equation must now be substituted in the equation for the variable gain amplifier in FIG. 10. This results in the following gain control equation:

$$VGA_{gain} = \frac{R_2}{R_2} \frac{I_2}{\frac{V_{REG}}{R_3}} \exp \frac{q}{kT} \left( \frac{R_6}{R_5 + R_6} \right) V_c$$

The exponential shown can be converted to the base 10 by a multiplication constant to express the gain in db's. Note that the gain of the variable gain amplifier has now become temperature dependent which can be minimized to some extent by operating point choice. However, it may be quite desirable to put transmitters $Q_1$ and $Q_2$ in a temperature controlled environment.

The circuit as shown in FIG. 11 has a shortcoming if rapid changes of control voltage occur. That is, a rapid increase, for instance, in $V_c$ will cause a rapid decrease in $I_1$ and so a rapid decrease in the voltage drop across diode $D_1$. For proper operation, the voltage drop across diode $D_2$ should shift in exact correspondence with that across diode $D_1$, but cannot since $I_2$ is constant and capacitor $C_2$ cannot change the voltage thereacross rapidly enough to follow a sufficiently fast change in voltage drop across diode $D_1$. Hence, there must be a current drawn through capacitor $C_2$ to make such a voltage change across diode $D_2$. This capacitor current flows through $R_2$ and $D_2$ causing improper gain and a transient voltage to appear at the output.

If the change in control voltage $V_c$ is slow enough only a negligible transient will occur, but if sufficiently fast, serious errors may appear. This can be avoided entirely by removing the non-inverting output of amplifier $A_2$ from ground and connecting it along the dotted line shown to the base of transistor $Q_1$. Then any rapid changes in $V_c$ will cause the same rapid change on both sides of capacitor $C_2$ and no transient current will be drawn therethrough.

For the circuits of FIGS. 10 and 11 to operate with low distortion, the voltage variation across capacitor $C_2$ must be small relative to the voltage variation across the diode $D_2$. This will be true if $(I_2 + i_b)\max/\omega_{min} C_2 << 0.0265$ volts. Here, $(I_2 + i_b)$ max represents the peak current through diode $D_2$ and $\omega_{min}$ represents the frequency of the lowest input voltage frequency component which the variable gain amplifiers of FIGS. 10 and 11 must pass with low distortion.

The embodiments of the invention in which an exclusive property or right is claimed are defined as follows:

1. A variable gain amplifier for amplifying non-zero frequency components of an input signal, said amplifier comprising:
    a first characteristic means, having a nonlinear voltage-current relationship occurring between first and second terminals thereof, capable of carrying a significant current directed from said first terminal to said second terminal;
    a second characteristic means, having a nonlinear voltage-current relationship occurring between third and fourth terminals thereof, capable of carrying a significant current directed from said third terminal to said fourth terminal, said second and fourth terminals being electrically connected together;
    an input means connected to said first terminal to provide input signal current through said first characteristic means, between said first and second terminals, which is related to said input signal;
    a first capacitive means connected in series between said third terminal and an output terminal; and
    maintaining means to maintain selected non-zero frequency voltage components occurring between said first and second terminals substantially equal to corresponding non-zero frequency components occurring between said third and fourth terminals.

2. The apparatus of claim 1 wherein a first current source is connected to provide current through said first characteristic means between said first and second terminals.

3. The apparatus of claim 2 wherein a second current source is connected to provide current through said second characteristic means between said third and fourth terminals.

4. The apparatus of claim 3 wherein said maintaining means comprises a first operational amplifier having an inverting input thereof connected to said first terminal and having an output thereof connected to said second terminal and, further comprising, a second operational amplifier having and inverting input thereof connected intermediate to said first capacitive means and said output terminal and having an output thereof connected to said output terminal.

5. The apparatus of claim 4 wherein gain control of said variable gain amplifier is exercised by selectively varying values of currents obtained from said first current source and said second current source.

6. The apparatus of claim 5 wherein said input signal is a voltage signal and said input means is a first resistive means connected in series with a second capacitive means between said first terminal and a source of said input signal voltage.

7. The apparatus of claim 6 wherein a second resistive means is connected between said inverting input of said second operational amplifier and said output terminal.

8. The apparatus of claim 5 wherein a first resistive means is connected between said inverting input of said second operational amplifier and said output terminal.

9. The apparatus of claim 5 wherein said first and second characteristic means are diode means with said first and third terminals electrically connected to anodes of said diode means and said second and fourth terminals electrically connected to cathodes of said diode means.

10. The apparatus of claim 5 wherein a selected one of said first and second current sources has a fixed current output value with said current source remaining providing a current output which is exponentially related to a control voltage.

11. The apparatus of claim 10 wherein said control voltage is also applied to a non-inverting input of said second operational amplifier.

12. The apparatus of claim 10 wherein said remaining current source, exponentially related to said control voltage, provides said current output as a collector current from a collector of a first transistor which also has an emitter and a base with a base-emitter voltage drop that can be varied by said control voltage.

13. The apparatus of claim 12 wherein said collector current is maintained at a selected value when said control voltage is substantially zero by having said first transistor emitter electrically connected to an emitter of a second transistor, said second transistor having its collector current set at a value by a feedback loop in which a third operational amplifier senses said collector current of said second transistor to adjust a voltage applied to said emitters.

14. The apparatus of claim 13 wherein said first and second characteristic means are diode means with said first and third terminals electrically connected to anodes of said diode means and said second and fourth terminals electrically connected to cathodes of said diode means.

15. The apparatus of claim 3 wherein gain control of said variable gain amplifier is exercised by selectively varying values of currents obtained from said first current source and said second current source.

16. The apparatus of claim 1 wherein a first current source is connected to provide current through said second characteristic means between said third and fourth terminals.

17. The apparatus of claim 1 wherein said maintaining means comprises a first operational amplifier having an inverting input thereof connected to said first terminal and having an output thereof connected to said second terminal and, further comprising, a second operational amplifier having an inverting input thereof connected intermediate to said first capacitive means and said output terminal and having an output thereof connected to said output terminal.

* * * * *